United States Patent
Meyer et al.

(10) Patent No.: US 9,679,098 B2
(45) Date of Patent: Jun. 13, 2017

(54) PROTOCOL PROBES

(71) Applicant: Mentor Graphics Corporation, Wilsonville, OR (US)

(72) Inventors: Andreas Meyer, Newburyport, MA (US); Adam Erickson, Waltham, MA (US); Michael Concannon, Waltham, MA (US); Robert Fredieu, Waltham, MA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 14/608,647

(22) Filed: Jan. 29, 2015

(65) Prior Publication Data

US 2016/0224713 A1 Aug. 4, 2016

(51) Int. Cl.
*G06F 17/50* (2006.01)

(52) U.S. Cl.
CPC .................. *G06F 17/5081* (2013.01)

(58) Field of Classification Search
CPC ............. G06F 17/5009; G06F 11/3692; G06F 17/5022
USPC ........................................................ 716/109
See application file for complete search history.

(56) References Cited

U.S. PATENT DOCUMENTS

| | | | | |
|---|---|---|---|---|
| 7,240,303 B1* | 7/2007 | Schubert et al. | ............. | 716/106 |
| 7,613,599 B2* | 11/2009 | Bade et al. | ..................... | 703/14 |
| 7,827,510 B1* | 11/2010 | Schubert et al. | ............. | 716/111 |
| 8,347,245 B2* | 1/2013 | Ogilvie et al. | ................ | 716/110 |
| 8,397,188 B1* | 3/2013 | Scheidt | ......................... | 716/106 |
| 8,868,397 B2 | 10/2014 | Alexanian et al. | | |
| 2008/0120085 A1 | 5/2008 | Alexanian et al. | | |
| 2008/0263486 A1* | 10/2008 | Alexanian et al. | ............... | 716/5 |
| 2010/0235135 A1 | 9/2010 | Conner | | |
| 2012/0005640 A1 | 1/2012 | Mehta | | |
| 2015/0261903 A1* | 9/2015 | Jose | .............................. | 716/109 |
| 2015/0324505 A1* | 11/2015 | James et al. | .................. | 716/109 |

\* cited by examiner

*Primary Examiner* — Suchin Parihar

(74) *Attorney, Agent, or Firm* — Mentor Graphics Corporation

(57) ABSTRACT

This application discloses a computing system to provide test stimulus to an electronic device modeled in a verification environment by the computing system. The computing system can identify transactions performed by the electronic device in the verification environment based, at least in part, on messages exchanged over an interconnect in the electronic device in response to the test stimulus. The computing system can output the transactions from the verification environment and bundle a plurality of the transactions based, at least in part, on messaging relationships defined by a communication protocol for the interconnect. The computing system can utilize the bundles of transactions to determine whether the electronic device functions in accordance with the communication protocol.

20 Claims, 7 Drawing Sheets

PROTOCOL PROBES

TECHNICAL FIELD

This application is generally related to electronic design automation and, more specifically, to verification of protocol implementation by an electronic system described in a circuit design.

BACKGROUND

Microdevices, such as integrated microcircuits and microelectromechanical systems (MEMS), are used in a variety of products, from automobiles to microwaves to personal computers. Designing and fabricating microdevices typically involves many steps, known as a "design flow." The particular steps of a design flow often are dependent upon the type of microcircuit, its complexity, the design team, and the microdevice fabricator or foundry that will manufacture the microcircuit. Typically, software and hardware "tools" verify the design at various stages of the design flow by running software simulators and/or hardware emulators, and errors in the design are corrected or the design is otherwise improved.

Several steps are common to most design flows for integrated microcircuits. Initially, the specification for a new circuit is transformed into a logical design, sometimes referred to as a register transfer level (RTL) description of the circuit. With this logical design, the circuit can be described in terms of both the exchange of signals between hardware registers and the logical operations that can be performed on those signals. The logical design typically employs a Hardware Design Language (HDL), such as the Very high speed integrated circuit Hardware Design Language (VHDL). As part of the creation of a logical design, a designer will also implement a place-and-route process to determine the placement of the various portions of the circuit, along with an initial routing of interconnections between those portions. The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices, such as transistors, resistors, and capacitors, which will be used in the circuit, along with their interconnections. This device design generally corresponds to the level of representation displayed in conventional circuit diagrams. Preliminary timing estimates for portions of the circuit may be made at this stage, using an assumed characteristic speed for each device. In addition, the relationships between the electronic devices are analyzed, to confirm that the circuit described by the device design will correctly perform the desired functions. This analysis is sometimes referred to as "formal verification."

Once the relationships between circuit devices have been established, the design can be again transformed, this time into a physical design that describes specific geometric elements. This type of design often is referred to as a "layout" design. The geometric elements, which typically are polygons, define the shapes that will be created in various materials to manufacture the circuit. Typically, a designer will select groups of geometric elements representing circuit device components, e.g., contacts, gates, etc., and place them in a design area. These groups of geometric elements may be custom designed, selected from a library of previously-created designs, or some combination of both. Once the groups of geometric elements representing circuit device components have been placed, geometric elements representing connection lines then are then placed between these geometric elements according to the predetermined route. These lines will form the wiring used to interconnect the electronic devices.

Typically, a designer will perform a number of analyses on the resulting layout design data. For example, with integrated circuits, the layout design may be analyzed to confirm that it accurately represents the circuit devices and their relationships as described in the device design. The layout design also may be analyzed to confirm that it complies with various design requirements, such as minimum spacings between geometric elements. Still further, the layout design may be modified to include the use of redundant geometric elements or the addition of corrective features to various geometric elements, to counteract limitations in the manufacturing process, etc. For example, the design flow process may include one or more resolution enhancement technique (RET) processes, that modify the layout design data to improve the usable resolution of the reticle or mask created from the design in a photolithographic manufacturing process.

After the layout design has been finalized, it is converted into a format that can be employed by a mask or reticle writing tool to create a mask or reticle for use in a photolithographic manufacturing process. The written masks or reticles then can be used in a photolithographic process to expose selected areas of a wafer to light or other radiation in order to produce the desired integrated microdevice structures on the wafer.

Returning to "functional verification," this type of analysis begins with a circuit design coded at a register transfer level (RTL), which can be simulated and/or emulated by a design verification tool. The design verification tool can generate test stimulus that, when provided to the circuit design, can exercise the functionality of the circuit design. To inspect the operation of the circuit design in response to the test stimulus, verification engineers often employ Verification Intellectual Property (VIP) blocks written in a verification language, such as SystemVerilog or Universal Verification Methodolgy (UVM), which can run in a hardware modeling language along with the circuit design. During operation of the circuit design, these VIP blocks can monitor signals in the circuit design and perform on-the-fly checks of those signals.

While VIP blocks can check functional operation of the circuit design running in the hardware modeling language, as functionality becomes more complex, such as functionality of distributed state machines in the circuit design, communication protocols implemented in the circuit design, or the like, the VIP blocks can become large pieces of code that consume a non-trivial portion of processing resources or hardware capacity of a system implementing the hardware modeling language. As a result, many verification engineers limit their utilization of VIP blocks to check whether single instances of a state machine or communication protocol is following the specification. For example, the VIP blocks can check that a processor issues a snoop message when a particular type of transaction occurred, but do not attempt to track progress of that snoop message through the circuit design to see that another processor or snoop filter reacted correctly to the snoop message. In another example, for any distributed state machine, such as a coherent cache, the VIP blocks typically check that one piece of the state machine works, but will not verify the functionality of the entire state machine. In other words, while VIP blocks can allow the system implementing the hardware modeling language to perform check simple functionality, attempts to utilize VIP blocks to perform larger checks of sub-systems, protocols, and state machines of the circuit design comes with performance and resource tradeoffs that render their use impractical.

SUMMARY

This application discloses tools and mechanisms for verification of protocol implementation by an electronic system described in a circuit design. According to various embodiments, the tools and mechanisms can provide test stimulus to the electronic device modeled in a verification environment by the computing system. The computing system can identify transactions performed by the electronic device in the verification environment based, at least in part, on messages exchanged over an interconnect in the electronic device in response to the test stimulus. For example, the electronic device modeled in the verification environment can include protocol probes, which can monitor the messages exchanged over the interconnect and build transactions based on the monitored messages. The protocol probes can output the transactions from the verification environment, which can allow the computing system to bundle a plurality of the transactions based, at least in part, on messaging relationships defined by a communication protocol for the interconnect. The computing system can utilize the bundles of transactions to determine whether the electronic device functions in accordance with the communication protocol.

DETAILED DESCRIPTION

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads.

Figure 1:
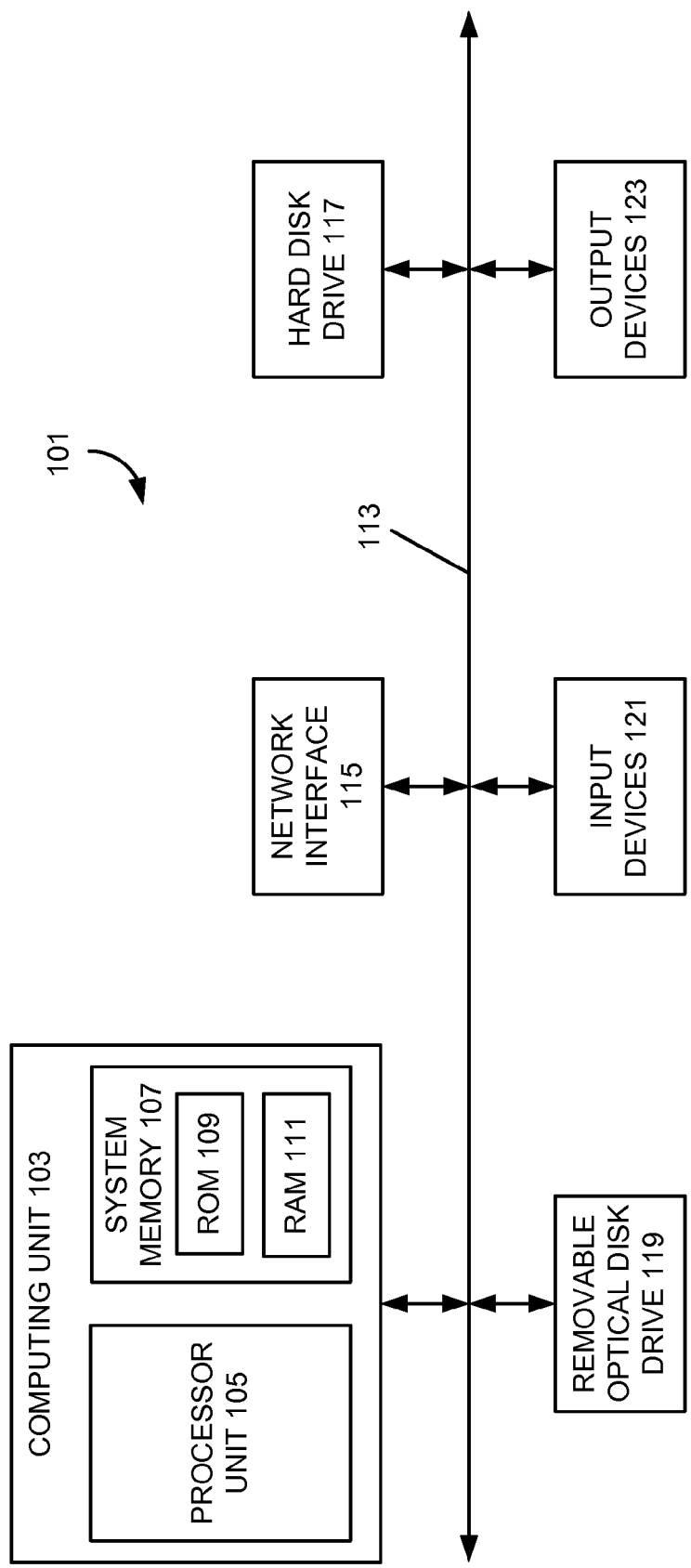
FIGS. 1 and 2 illustrate an example of a computer system of the type that may be used to implement various embodiments of the invention.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Figure 2:
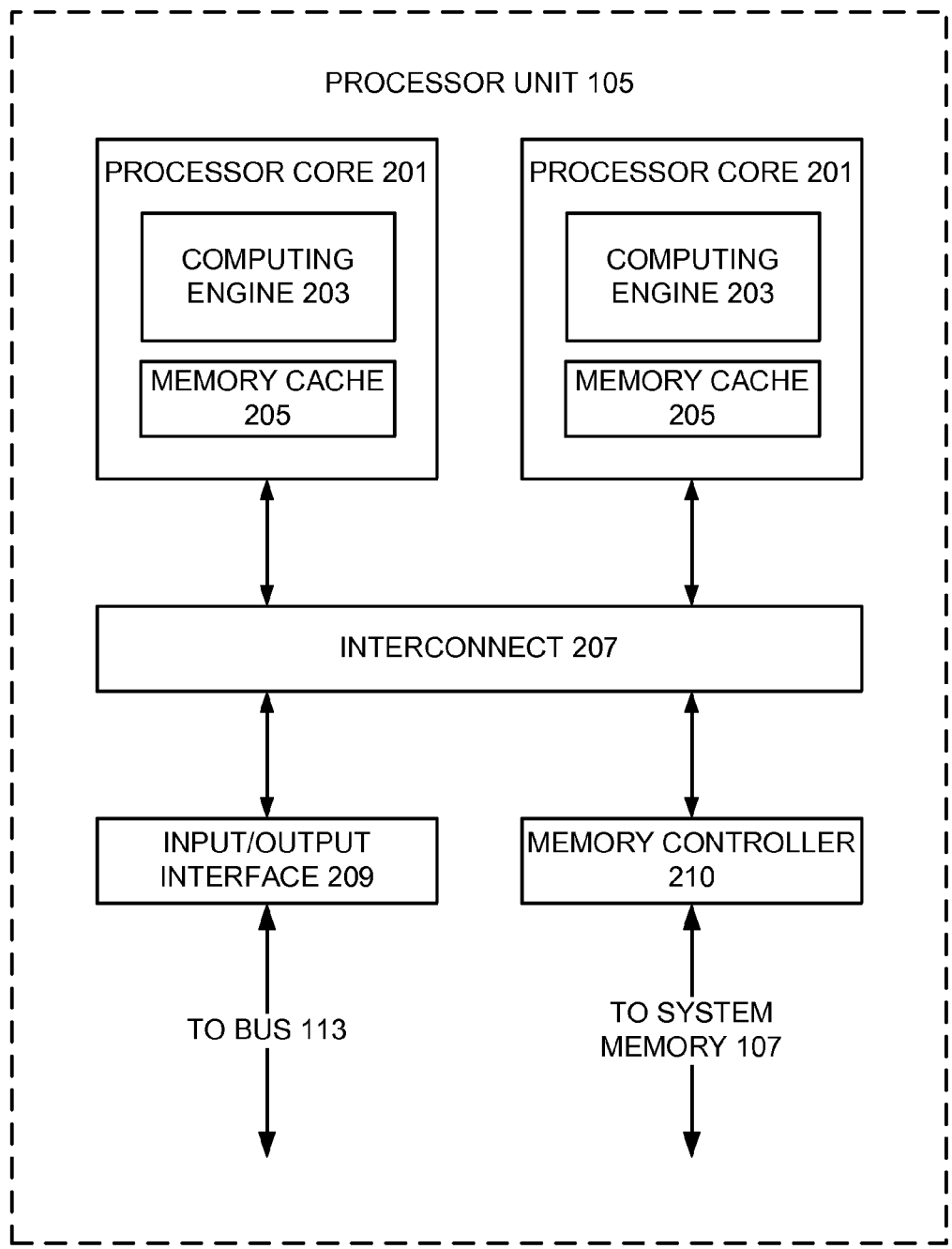

With some implementations of the invention, the processor unit 105 can have more than one processor core. Accordingly, FIG. 2 illustrates an example of a multi-core processor unit 105 that may be employed with various embodiments of the invention. As seen in this figure, the processor unit 105 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 113. Similarly, the memory controller 211 controls the exchange of information between the processor unit 201 and the system memory 107. With some implementations of the invention, the processor units 201 may include additional components, such as a high-level cache memory accessible shared by the processor cores 201.

It also should be appreciated that the description of the computer network illustrated in FIG. 1 and FIG. 2 is provided as an example only, and it not intended to suggest any limitation as to the scope of use or functionality of alternate embodiments of the invention.

Design Verification with Protocol Probes

Figure 3:
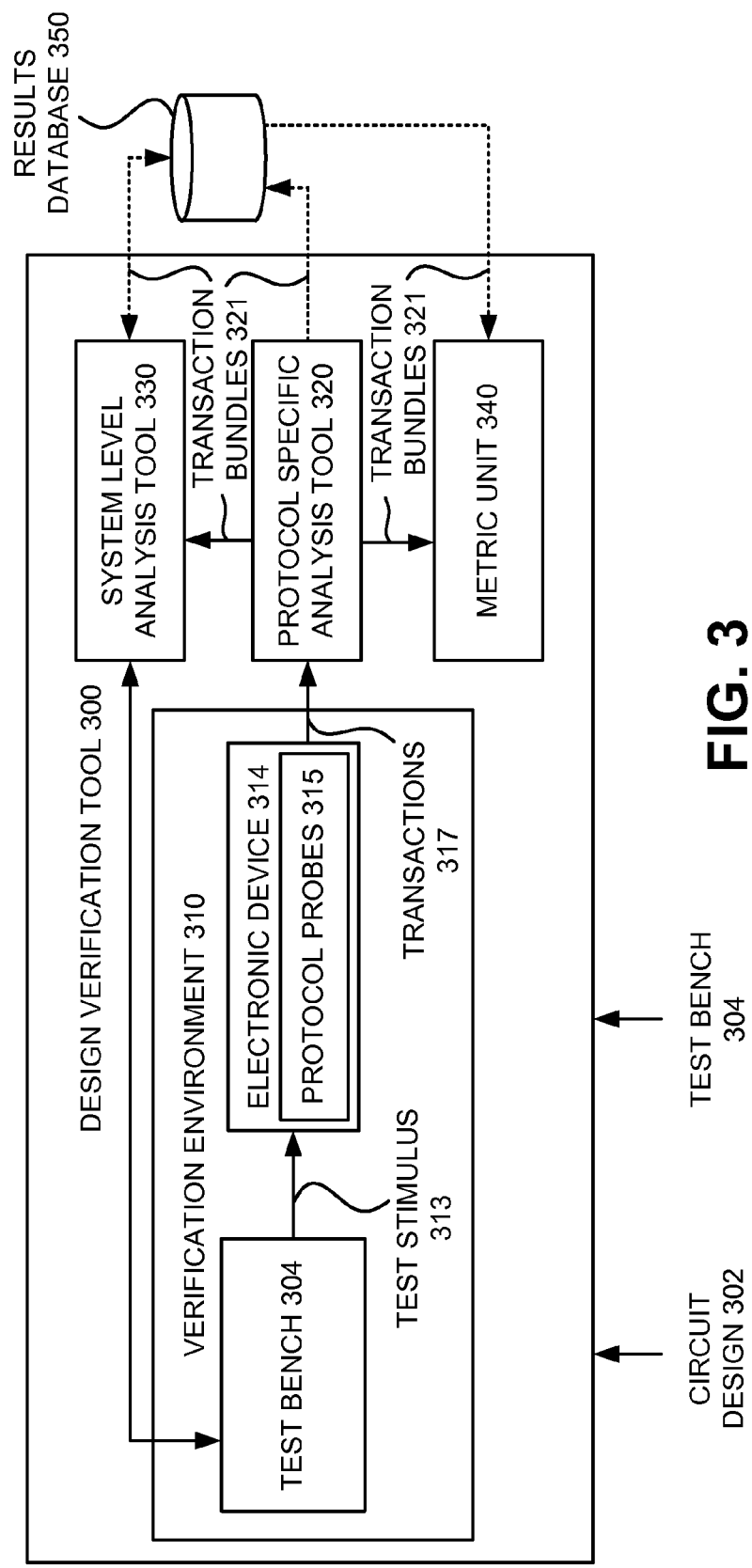
FIG. 3 illustrates an example of a design verification tool to perform a protocol-based analysis that may be implemented according to various embodiments of the invention.

FIG. 3 illustrates an example of a design verification tool 300 to perform a protocol-based analysis that may be implemented according to various embodiments of the invention. Referring to FIG. 3, the design verification tool 300 can implement or control a verification environment 310, which can include an electronic device 314 and a test bench 304. The design verification tool 300 can prompt the test bench 304 in the verification environment 310 to provide test stimulus 313 to the electronic device 314, which can be utilized to functionally verify the electronic device 314. In some embodiments, the verification environment 310 can be implemented by at least a portion of a simulator, an emulator, hardware system, which can include prototype of the electronic device 314, manufactured post-silicon device, a combination thereof, or the like.

In some embodiments, the design verification tool 300 can model the electronic device 314 based on a circuit design 302. The design verification tool 300 can receive the circuit design 302, which can describe the electronic device 314 both in terms of an exchange of data signals between components in the electronic device 314, such as hardware registers, flip-flops, combinational logic, or the like, and in terms of logical operations that can be performed on the data signals in the electronic device. The circuit design 302 can model the electronic device at a register transfer level (RTL), for example, with code in a hardware description language (HDL), such as System Verilog, Very high speed integrated circuit Hardware Design Language (VHDL), or the like. In some embodiments, the design verification tool 300 can receive the circuit design 302 from a source external to the design verification tool 300, such as a user interface of the computing device 101, another tool implemented by the computing device 101, or the design verification tool 300 may internally generate the circuit design 302.

The design verification tool 300 also can receive the test bench 304, which can generate the test stimulus 313 capable of being utilized to functionally verify the electronic device 314, for example, by providing test scenarios to determine whether the electronic device 314 can function as expected. In some embodiments, the design verification tool 300 can receive the test bench 304 from a source external to the design verification tool 300, such as a user interface of the computing device 101, another tool implemented by the computing device 101, or the design verification tool 300 may internally generate the test bench 304.

The design verification tool 300 can insert one or more protocol probes 315 to the electronic device 314 implemented in the verification environment 310, which can capture transactions 317 that are performed by the electronic device 314 in response to the test stimulus 313 from the test bench 304. As will be discussed below in greater detail, the protocol probes 315, in some embodiments, can be coupled between a corresponding component and at least one interconnect in the electronic device 314, which can allow the protocol probes 315 to intercept messages transmitted between the interconnect and their corresponding component. The protocol probes 315 can build the transactions 317 from the intercepted messages based on message relationships defined in a communication protocol. For example, when a processor in the electronic device 314 issues a read request message over an interconnect, the protocol probes 315 can intercept or monitor the read request message and any subsequent response message received by the processor from the interconnect, and build a transaction corresponding to the intercepted messages. In some embodiments, the transactions 317 built by the protocol probes 315 can include minimal transactional representation associated with the message(s), such as an operation associated with the message(s), data associated with the message(s), a time associated with the message(s), or the like.

When the verification environment 310 utilizes a simulation engine to simulate the circuit design 302 to implement the electronic device 314, the design verification tool 300 can either modify the circuit design 302 to include the protocol probes 315 or utilize a bind command in a System Verilog language, which can instantiate the protocol probes 315 in portions of the electronic device 314 during simulation. In some embodiments, the protocol probes 315 can be coded in a synthesizable register transfer level (RTL) hardware description language, which can allow them to be synthesized or otherwise converted with the circuit design 302 into a gate-level representation, such as a netlist. This synthesized representation of the circuit design 302 and protocol probes 315 can be utilized to implement at least one hardware-based verification scheme in the verification environment 310, such as with an emulator to emulate the electronic device 314 based on the circuit design, with a prototype of the electronic device 314, or with a post-silicon manufactured version of the electronic device 314.

Rather than perform any functional checks or analysis in the verification environment 310, the protocol probes 315 can output the transactions 317 from the verification environment 310, for example, to a protocol specific analysis tool 320 included in the design verification tool 300. For example, when the verification environment 310 simulates the electronic device 314, the protocol probes 315 can output the transactions 317 built from simulated messages in the electronic device 314 through a program interface, such as a direct programming interface (DPI) function when utilizing a System Verilog hardware modeling language. In other examples, when the verification environment 310 implements a hardware-based environment, such as emulation, prototyping, or post-silicon manufacture, the hardware-based-implementation of the protocol probes 315 can output the transactions 317 through one or more input/output ports or interfaces of the hardware implementing the electronic device 314.

By having the protocol probes 315 capture the transactions 317, which, for example, can correspond to a minimal transactional representation, and then output the transactions 317 from the verification environment 310 for subsequent analysis and functional checks, the design verification tool 300 can reduce the utilization of resources supporting the verification environment 310. This reduction in resource utilization, which previously was being utilized to perform on-the-fly functionality checks, performance analysis, and coverage analysis, can allow the verification environment 310 to improve capacity and/or performance.

The protocol specific analysis tool 320 can bundle a plurality of transactions 317 on a per protocol basis. In some embodiments, the protocol specific analysis tool 320 can identify messaging relationships defined by a communication protocol for the interconnect and/or a configuration of the electronic device 314, and then selectively bundle transactions 317 that are deemed related based on the messaging relationships and electronic device configuration. For example, in a multiple processor system, when one processor issues a read request message, the other processors should snoop the read request message, determine whether they include a copy of the requested data stored in a local cache, and, if so, respond to the read request message. The protocol specific analysis tool 320, based on the configuration of the electronic device 314 and messaging relationships in the communications, can selectively bundle transactions associated with the read request message, the snooping of the message, and any response to the read request message.

In some embodiments, the bundling of the transactions 317 by the protocol specific analysis tool 320 can generate bundled transactions 321, which may have a generic format. For example, the protocol specific analysis tool 320 can analyze information in a group of related transaction to identify a source component in the electronic device 314 and a target component in the electronic device 314 for a bundled transaction 321 and to identify a bundling time for the bundled transaction 321. The protocol specific analysis tool 320 can generate the bundled transaction 321, which include the source and target component and the bundling time.

The design verification tool 300 can include a results database 350 to store the transaction bundles 321 generated by the protocol specific analysis tool 320. The design verification tool 300 (or another tool) can access the results database 350 to retrieve the transaction bundles 321 and perform functional protocol-level checks, identify test bench coverage at a protocol-level, and/or implement performance analysis.

The design verification tool 300 can include a metric unit 340 to receive the transaction bundles 321 from the results database 350 or the protocol specific analysis tool 320, and utilize the transaction bundles 321 to determine whether the electronic device 314 functions in accordance with or conforms to a communication protocol. For example, the metric unit 340 can analyze at least one transaction bundle 321 to determine whether the electronic device 314 generated messages as specified in the communication protocol.

The metric unit 340 also can utilize the transaction bundles 321 to determine a protocol-level coverage by the test stimulus 313 or performance or power analysis of the functionality of the electronic device 314. For example, the metric unit 340 can determine protocol-level coverage by the test stimulus 313 by performing a coherence or consistence coverage analysis, i.e., determine to what extent the test stimulus 313 exercised distributed state functionality in the electronic device 314, or identify a regression efficiency, i.e., what additional coverage points were hit by a particular set of the test stimulus 313.

The design verification tool 300 can include a system level analysis tool 330 to perform cross-protocol analysis of the transaction bundles 321. This type of analysis can attempt to correlate transaction bundles 321 corresponding to different protocols in the electronic device 314. For example, when a processor in the electronic device 314 issues a read request message utilizing a first protocol, and a memory controller, in response to the read request message, accesses a memory system utilizing to a second protocol, the system level analysis tool 330 can correlate transaction bundles 321 corresponding to messages sent utilizing the two different protocols.

The system level analysis tool 330, in some embodiments, can identify which transaction bundles 321 to correlate to each other based on one or more identifiers for the transaction bundles 321. For example, the system level analysis tool 330 can access an address translator, such as a memory management unit in the electronic device 314, which can include identifiers for messages correlated across multiple protocols. The system level analysis tool 330 can utilize these identifiers to correlate the transaction bundles 321 across different protocols.

The system level analysis tool 330 can utilize cross-protocol correlated transaction bundles to identify system-level interactions in the electronic device 314. For example, the electronic device 314 may experience a live lock event where message ordering on different interconnects or fabrics comes in direct contradiction, i.e., where each interconnect is waiting for the other interconnect to send its message first and thus locks utilization of both interconnects. The system level analysis tool 330 can analyze cross-protocol correlated transaction bundles to determine whether a live lock event has occurred.

The system level analysis tool 330 also can utilize cross-protocol correlated transaction bundles to analyze how the test bench 304 exercises the system-level functionality of the electronic device 314. The system level analysis tool 330 can receive a copy of the test stimulus 313 from the test bench 304, or at least a portion of the test stimulus 313 associated with a bundling time in the transaction bundles. The system level analysis tool 330 can correlate test stimulus 313 with the cross-protocol correlated transaction bundles, for example, to identify which system-level functionality the test stimulus 313 covered.

The system level analysis tool 330 also can provide feedback to the test bench 304 with regards to what system-level functionality has been covered by prior issued test stimulus 313. The test bench 304, in response to the feedback, can provide directed random stimulus or constrained random stimulus to the electronic device 314. In some embodiments, the test bench 304 can selectively refrain from issuing subsequent test stimulus to the electronic device 314 that would exercise the same functionality as previously issued test stimulus 313.

Figure 4:
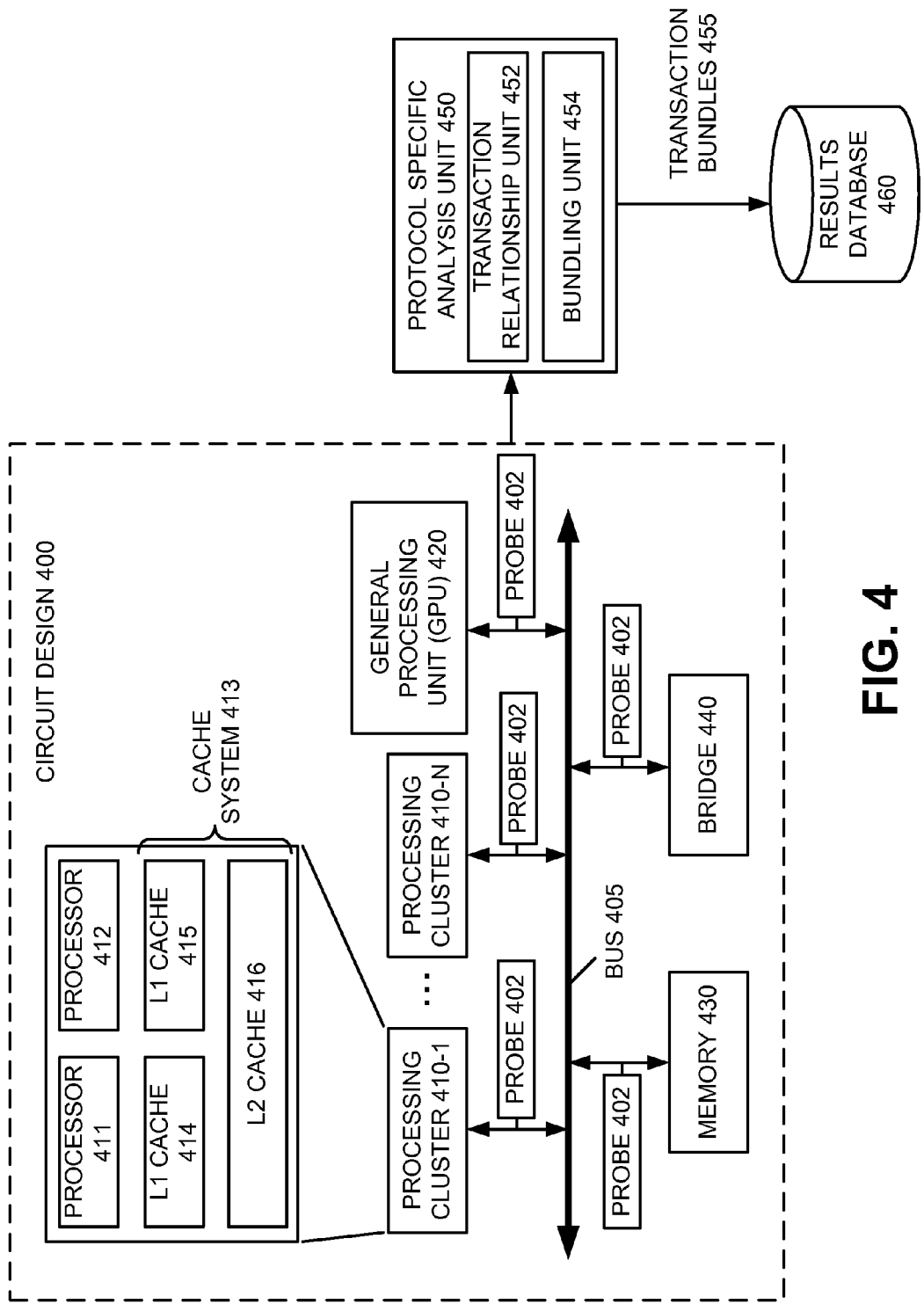
FIG. 4 illustrates an example implementation of transaction capture with protocol probes and protocol-specific analysis according to various embodiments of the invention.

FIG. 4 illustrates an example implementation of transaction capture with protocol probes and protocol-specific analysis according to various embodiments of the invention. Referring to FIG. 4, the circuit design 400 can include multiple master components, such as processing clusters 410-1 to 410-N, general processing unit (GPU) 420, or the like, and multiple slave components, such as memory 430, bridge 440, or the like, to communicate with each other over a bus 405.

The processing clusters 410-1 to 410-N can each include multiple processors and a cache system to store data, for example, from the memory 430, for utilization by the processors. For example, the processing cluster 410-1 can include processors 411 and 412, and a cache system 413 having level-1 (L1) caches 414 and 415 and a level-2 (L2) cache 416 available to store data for use by the processors 411 and 412. In some embodiments, the processing clusters 410-1 to 410-N can implement a cache coherency protocol, such as MSI, MESI, MOESI, MERSI, MESIF, write-once, or the like, to ensure consistency of data stored in the different caches from a common physical address of a shared resource, such as the memory 430.

A test bench (not shown) in a verification environment can provide test stimulus to the circuit design 400, which can prompt the circuit design 400 to perform various operations. The circuit design 400 can include various protocol probes 402 to monitor messages or other events in the circuit design 400 that were prompted by the test stimulus from the test bench. Each of the protocol probes 402 can capture the monitored messages and generate or build transactions based on the messages. The protocol probes 402 can output the transactions to a protocol specific analysis unit 450.

The protocol specific analysis unit 450 can selectively bundle the transactions generated by the protocol probes 402, for example, generating transaction bundles 455, with the protocol specific analysis unit 450 can store in a results database 460. In some embodiments, a design verification tool, such as the design verification tool 300 shown FIG. 3, can access the results database 460 to analyze and possibly correlate information stored therein to perform protocol-level and/or system-level analysis for the circuit design 400, to perform test bench coverage analysis, or to perform functional performance or power analysis on the circuit design 400.

The protocol specific analysis unit 450 can include a transaction relationship unit 452 to identify transactions that are related to each other, for example, are part of a larger protocol-level transaction, based on messaging relationships defined by a communication protocol for the bus 405. In some embodiments, the transaction relationship unit 452 can identify transactions that are related to each other based, in part, on a configuration of the electronic device 314. For example, since the circuit design 400 includes multiple processing clusters 410-1 to 410-N, the transaction relationship unit 452 can determine that the processing clusters 410-1 to 410-N should implement a cache coherency protocol.

The protocol specific analysis unit 450 can include a bundling unit 454 to selectively bundle transactions that are deemed related based on the messaging relationships and electronic device configuration. For example, in a multiple processor system, when one processor issues a read request message, the other processors should snoop the read request message, determine whether they include a copy of the requested data stored in a local cache, and, if so, respond to the read request message. The bundling unit 454 can selectively bundle transactions associated with the read request message, the snooping of the read request message, and any response to the read request message.

Figure 5:
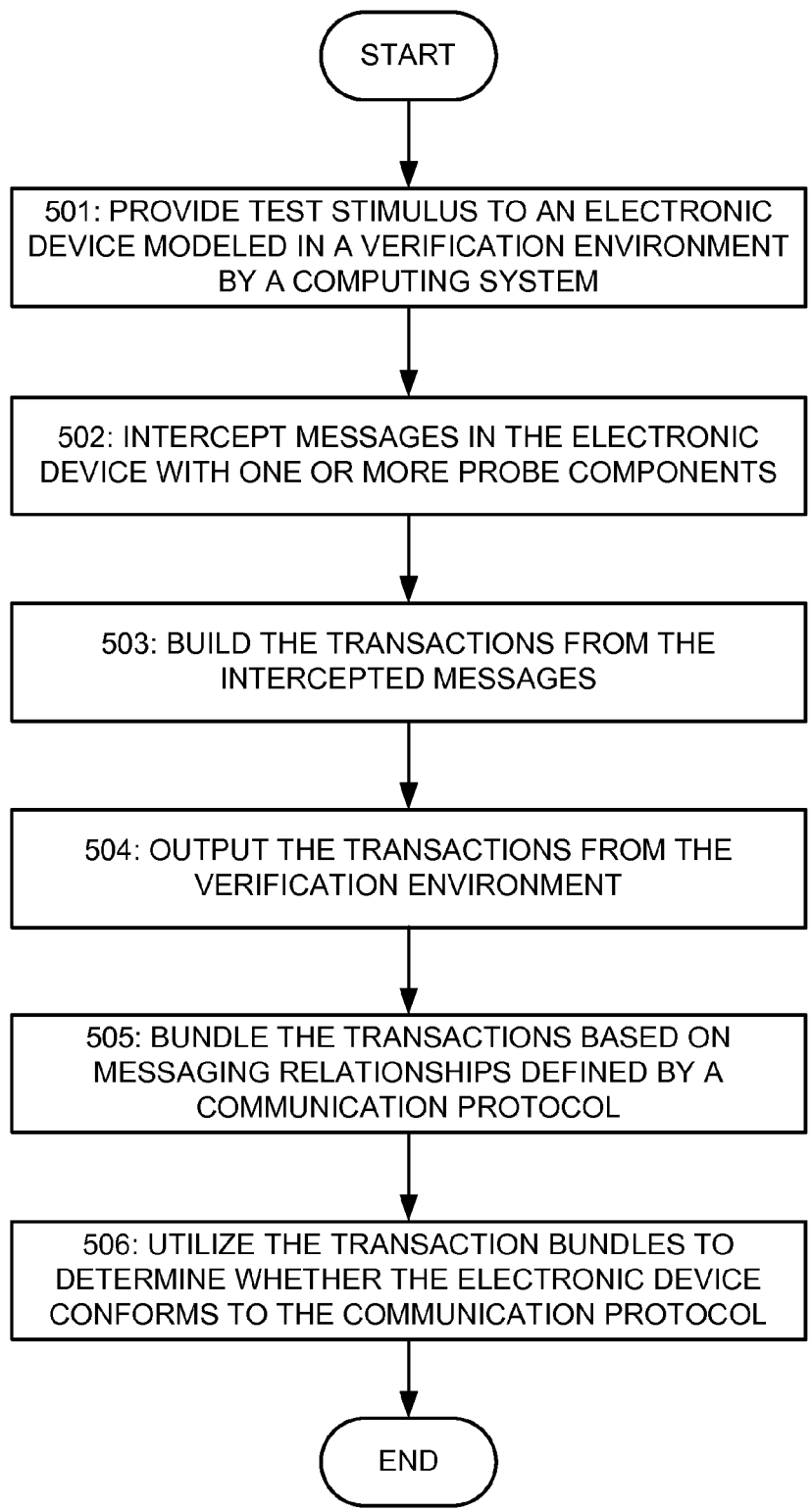
FIG. 5 illustrates a flowchart showing an example implementation of transaction capture with protocol probes and protocol-specific analysis according to various examples of the invention.

FIG. 5 illustrates a flowchart showing an example implementation of transaction capture with protocol probes and protocol-specific analysis according to various examples of the invention. Referring to FIG. 5, in a block 501, a computing system can provide test stimulus to an electronic device modeled in a verification environment by the computing system.

In some embodiments, the verification environment can include both the electronic device and a test bench. The computing system can prompt the test bench in the verification environment to provide test stimulus to the electronic device, which can be utilized to functionally verify the electronic device. The verification environment can model the electronic device in a software-based implementation supported by the computing device or hardware-based implementation supported by the computing device.

In some embodiments, the computing system can model the electronic device based on a circuit design that can describe the electronic device both in terms of an exchange of data signals between components in the electronic device, such as hardware registers, flip-flops, combinational logic, or the like, and in terms of logical operations that can be performed on the data signals in the electronic device. The circuit design can model the electronic device at a register transfer level (RTL), for example, with code in a hardware description language (HDL), such as System Verilog, Very high speed integrated circuit Hardware Design Language (VHDL), or the like.

In a block 502, the computing system can intercept messages in the electronic device with one or more probe components. The computing system can insert the probe components in the electronic device implemented in the verification environment, allowing them to monitor messages exchanged in the electronic device in response to the test stimulus from the test bench. In some embodiments, the one or more probe components can be written in a synthesizable hardware description language, which can allow them to utilized in different verification environments, such as in an emulator, hardware prototype, or even in a manufactured electronic device.

In a block 503, the computing system can build the transactions from the intercepted messages. The probe components can build the transactions from the intercepted messages based on message relationships defined in a communication protocol. For example, when a processor in the electronic device issues a read request message over an interconnect, the probe components can intercept or monitor the read request message and any subsequent response message received by the processor from the interconnect, and build a transaction corresponding to the intercepted messages. In some embodiments, the transactions built by the probe components can include minimal transactional representation associated with the message(s), such as an operation associated with the message(s), data associated with the message(s), a time associated with the message(s), or the like.

In a block 504, the computing system can output the transactions from the verification environment. The probe components can output the transactions from the verification environment, for example, to a protocol specific analysis tool implemented by the computing system. For example, when the verification environment simulates the electronic device, the probe components can output the transactions built from simulated messages in the electronic device through a program interface, such as a direct programming interface (DPI) function when utilizing a System Verilog hardware modeling language. In other examples, when the verification environment implements a hardware-based environment, such as emulation, prototyping, or post-silicon manufacture, the hardware-based-implementation of the probe components can output the transactions through one or more input/output ports or interfaces of the hardware implementing the electronic device.

In a block 505, the computing system can bundle the transactions based on messaging relationships defined by a communication protocol. The computing system can implement a protocol specific analysis tool to bundle the transactions on a per protocol basis. In some embodiments, the computing system can bundle the transactions based on both the messaging relationships defined by the communication protocol and a configuration of the electronic device. In some embodiments, the bundling of the transactions can generate bundled transactions, which may have a generic format. For example, the computing system can analyze information in a group of related transaction to identify a source component in the electronic device and a target component in the electronic device for a bundled transaction and to identify a bundling time for the bundled transaction. The computing system can generate the bundled transaction, which include the source and target component and the bundling time.

In a block 506, the computing system can utilize the transaction bundles to determine whether the electronic device conforms to the communication protocol. In some embodiments, the computing system can utilize the transaction bundles to perform functional protocol-level checks, identify test bench coverage at a protocol-level, and/or implement performance analysis.

Figure 6:
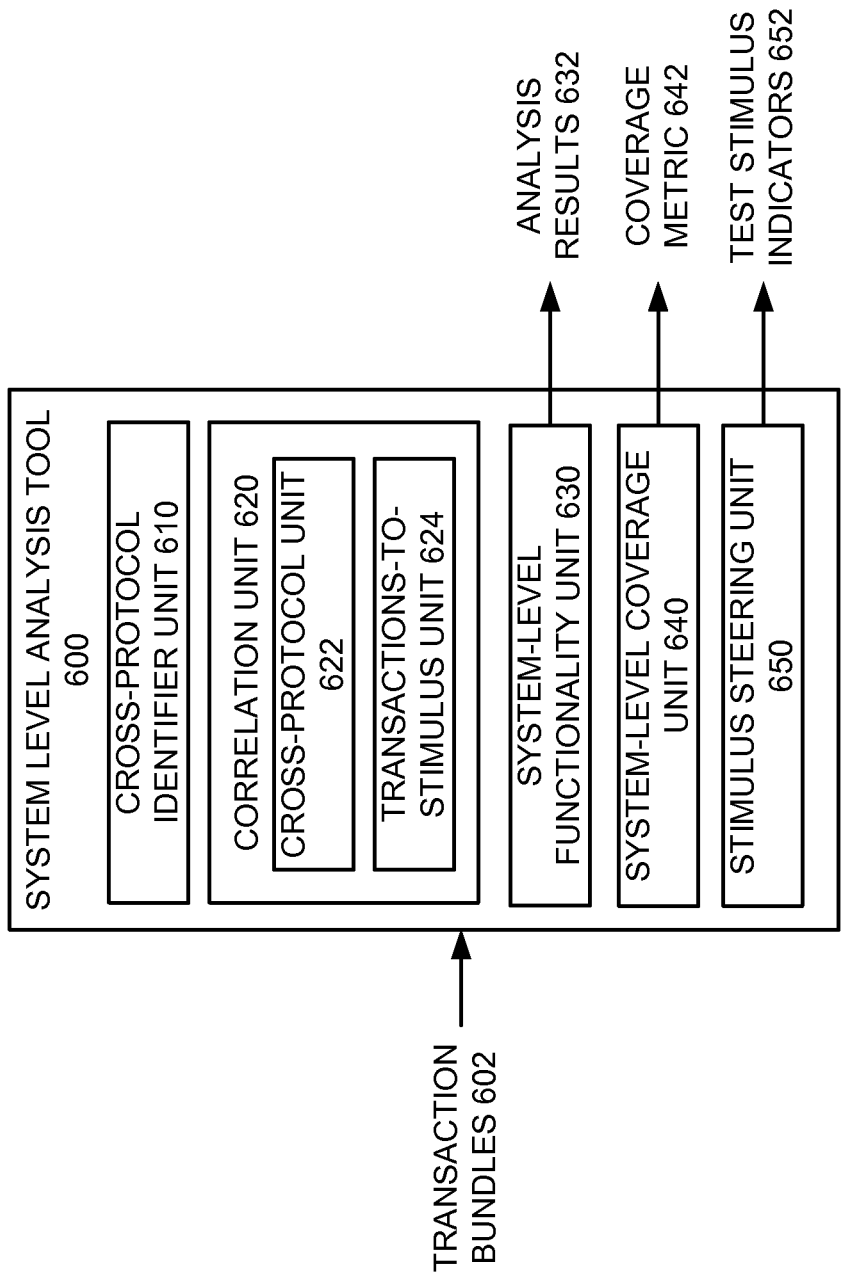
FIG. 6 illustrates an example implementation of a system level analysis tool for multiple-protocol systems according to various embodiments of the invention.

FIG. 6 illustrates an example implementation of a system level analysis tool 600 for multiple-protocol systems according to various embodiments of the invention. Referring to FIG. 6, the system level analysis tool 600 can correlate transaction bundles 602 corresponding to messages sent in different protocols and then perform system-level analysis based on the correlated transaction bundles 602. The system-level analysis tool 600 can analyze the cross-protocol functionality of an electronic system based on the correlated transaction bundles 602, analyze system level coverage based on the correlated transaction bundles 602, or the like.

The system level analysis tool 600 can include a cross-protocol identifier unit 610 to locate unique or distinguishing identifiers for the transaction bundles 602. The cross-protocol identifier unit 610 also can identify information that interrelates different protocols in the electronic device in the verification environment. For example, the system level analysis tool 600 can access an address translator, such as a memory management unit in the electronic device, which can include relationships between the identifiers for messages across multiple protocols.

The system level analysis tool 600 can include a correlation unit 620 to correlate the transaction bundles 602 to each other or to test stimulus provided to the electronic device used to generate messages utilized to generate the transaction bundles 602. The correlation unit 620 can include a cross-protocol unit 622 to perform cross-protocol analysis of the transaction bundles 602, which can attempt to correlate transaction bundles 602 corresponding to different protocols in the electronic device. For example, the correlation unit 620 can utilize the identifiers associated with messages used to generate the transaction bundles 602 to correlate the transaction bundles 602 across different protocols. The correlation unit 620 also can include a transactions-to-stimulus unit 624 to correlate transaction bundles 602 with the test stimulus provided to the electronic device used to generate messages utilized to generate the transaction bundles 602.

The system level analysis tool 600 can include a system-level functionality unit 630 to evaluate the system-level operation of the electronic device based on the correlated transaction bundles, and generate analysis results 632 to identify whether the system-level operation of the electronic device functioned correctly. The system level analysis tool 600 can utilize the correlated transaction bundles to identify system-level interactions in the electronic device. For example, the electronic device may experience a live lock event where message ordering on different interconnects or fabrics comes in direct contradiction, i.e., where each interconnect is waiting for the other interconnect to send its message first and thus locks utilization of both interconnects. The system-level functionality unit 630 can analyze correlated transaction bundles to determine whether a live lock event has occurred.

The system level analysis tool 600 can include a system-level coverage unit 640 to determine how the test stimulus provided to the electronic device exercised the system-level functionality of the electronic device based on the correlated transaction bundles. The system-level coverage unit 640 can generate a coverage metric 642 that can identify what system-level functionality, if any, the test stimulus prompted the electronic device to perform.

The system level analysis tool 600 can include a stimulus steering unit 650 to generate test stimulus indicators 652 that can identify what system-level functionality was covered by a set of test stimulus provided to the electronic device in the verification environment. A test bench, in response to the test stimulus indicators 652, can select additional test stimulus to provide to the electronic device in a directed random or constrained random manner. For example, when the test bench receives test stimulus indicators 652 that identify a certain type of system-level functionality has been covered, the test bench can elect to not provide test stimulus that would exercise the same system-level functionality in a redundant manner.

Figure 7:
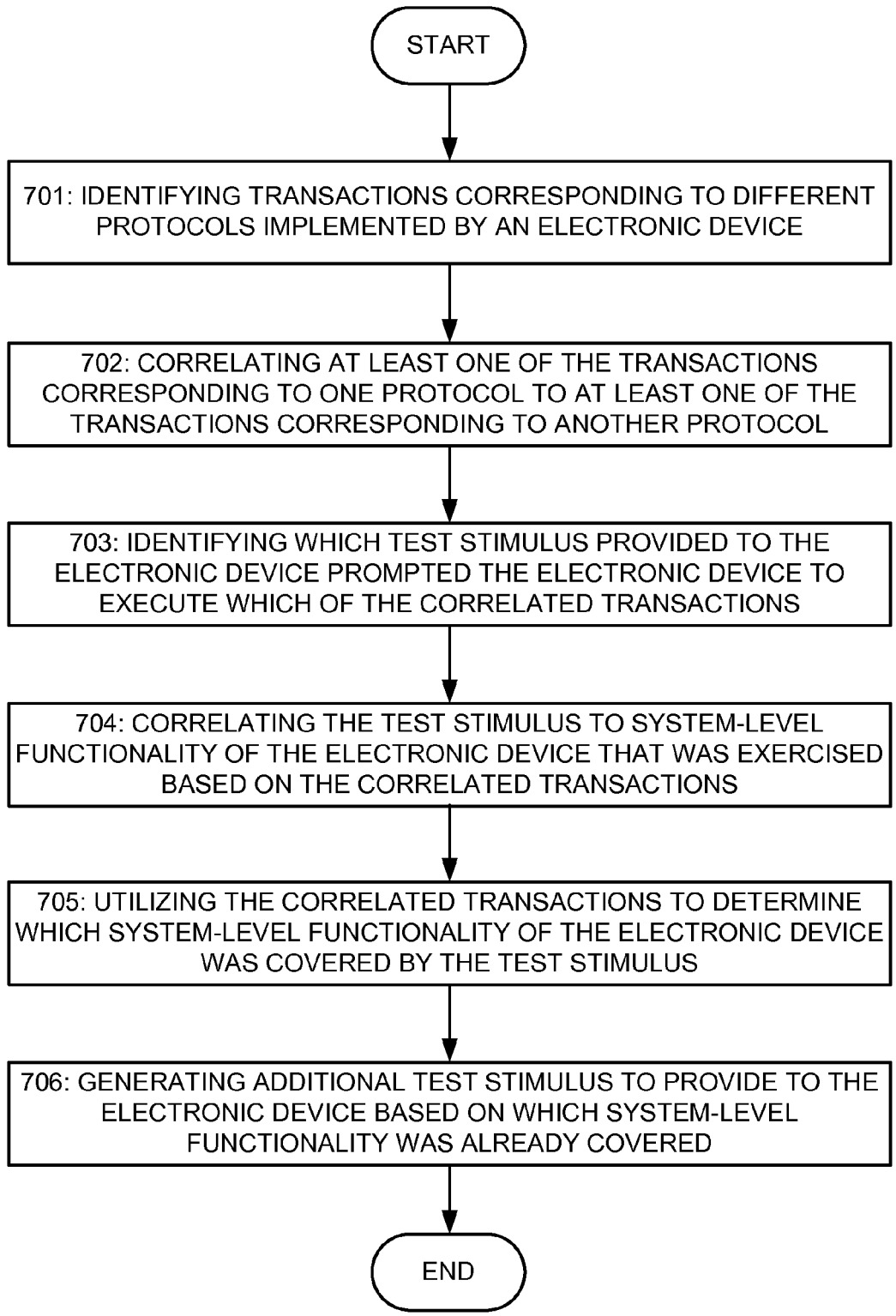
FIG. 7 illustrates a flowchart showing an example implementation of system level analysis for multiple-protocol systems according to various examples of the invention.

FIG. 7 illustrates a flowchart showing an example implementation of system level analysis for multiple-protocol systems according to various examples of the invention. Referring to FIG. 7, in a block 701, a computing system can identify protocol-level transactions corresponding to different protocols implemented by an electronic device in response to test stimulus provided in a verification environment.

In a block 702, the computing system can correlate at least one of the protocol-level transactions corresponding to one protocol to at least one of the protocol-level transactions corresponding to one protocol. The computing system can determine relationships between messages corresponding to the different protocols, and utilize identifiers of the messages in the protocol-level transactions to correlate the protocol-level transactions across the different protocols based on the relationships between messages corresponding to the different protocols.

In a block 703, the computing system can identify which of the test stimulus provided to the electronic device prompted the electronic device to execute which of the correlated transactions, and, in a block 704, correlate the test stimulus to the system-level functionality of the electronic device was exercised based on the correlated transactions.

In a block 705, the computing system can utilize the correlated transactions to determine which system-level functionality of the electronic device was covered by the test stimulus. The computing system also can utilize the correlated transactions to identify system-level functional errors by the electronic device, such as a live lock in the electronic system.

In a block 706, the computing system can generate test stimulus to provide to the electronic device based on which system-level functionality of the electronic device was already covered. In some embodiments, based on the identification of which system-level functionality of the electronic device was covered by the test stimulus, the computing system can elect to constrain or direct its random generation of test stimulus to avoid redundant exercise of the already covered system-level functionality.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

Conclusion

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
providing, by a computing system, test stimulus to an electronic device modeled in a verification environment by the computing system;
intercepting, with one or more probe components modeled in the verification environment, messages exchanged over an interconnect of the electronic device in response to the test stimulus;
generating, with the one or more probe components modeled in the verification environment, transactions performed by the electronic device in the verification environment based, at least in part, on the intercepted messages;

bundling, by the computing system, a plurality of the transactions based, at least in part, on messaging relationships defined by a communication protocol for the interconnect; and utilizing, by the computing system, the bundles of transactions to determine whether the electronic device functions in accordance with the communication protocol.

2. The method of claim 1, wherein generating transactions performed by the electronic device in the verification environment further comprises building the transactions from the intercepted messages.

3. The method of claim 1, wherein the one or more probe components are specified in a synthesizable hardware description language.

4. The method of claim 1, wherein bundling the plurality of the transactions is based on the messaging relationships defined by the communication protocol for the interconnect and a configuration of the electronic device.

5. The method of claim 1, further comprising outputting, by the computing system, the transactions from the verification environment, wherein bundling the plurality of the transactions is performed by the computing system outside of the verification environment.

6. The method of claim 1, further comprising utilizing, by the computing system, the bundles of transactions to determine at least one of coherence coverage, consistence coverage, or regression efficiency for the test stimulus, or performance analysis or power analysis for the functionality of the electronic device.

7. The method of claim 1, wherein the verification environment models the electronic device in a software-based implementation supported by the computing device or hardware-based implementation supported by the computing device.

8. A system comprising:

a non-transitory memory system configured to store computer-executable instructions; and a computing system, in response to execution of the computer-executable instructions, is configured to:

provide test stimulus to an electronic device modeled in a verification environment by the computing system, wherein one or more probe components modeled in the verification environment are configured to intercept, messages exchanged over an interconnect of the electronic device in response to the test stimulus and to generate, transactions performed by the electronic device in the verification environment based, at least in part, on the intercepted messages;

bundle a plurality of the transactions based, at least in part, on messaging relationships defined by a communication protocol for the interconnect; and utilize the bundles of transactions to determine whether the electronic device functions in accordance with the communication protocol.

9. The system of claim 8, wherein the computing system, in response to execution of the computer-executable instructions, is configured to build the transactions from the intercepted messages.

10. The system of claim 8, wherein the one or more probe components are specified in a synthesizable hardware description language.

11. The system of claim 8, wherein the computing system, in response to execution of the computer-executable instructions, is configured to bundle the plurality of the transactions based on the messaging relationships defined by the communication protocol for the interconnect and a configuration of the electronic device.

12. The system of claim 8, wherein the computing system, in response to execution of the computer-executable instructions, is configured to:

output the transactions from the verification environment; and bundle the plurality of the transactions outside of the verification environment.

13. The system of claim 8, wherein the computing system, in response to execution of the computer-executable instructions, is configured to utilize the bundles of transactions to determine at least one of coherence coverage, consistence coverage, or regression efficiency for the test stimulus, or performance analysis or power analysis for the functionality of the electronic device.

14. An apparatus comprising at least one non-transitory computer-readable memory device storing instructions configured to cause one or more processing devices to perform operations comprising:

providing test stimulus to an electronic device modeled in a verification environment by the computing system, wherein one or more probe components modeled in the verification environment are configured to intercept messages exchanged over an interconnect of the electronic device in response to the test stimulus, and to generate transactions performed by the electronic device in the verification environment based, at least in part, on the intercepted messages;

bundling a plurality of the transactions based, at least in part, on messaging relationships defined by a communication protocol for the interconnect; and utilizing the bundles of transactions to determine whether the electronic device functions in accordance with the communication protocol.

15. The apparatus of claim 14, wherein generating transactions performed by the electronic device in the verification environment further comprises building the transactions from the intercepted messages.

16. The apparatus of claim 14, wherein the one or more probe components are specified in a synthesizable hardware description language.

17. The apparatus of claim 14, wherein bundling the plurality of the transactions is based on the messaging relationships defined by the communication protocol for the interconnect and a configuration of the electronic device.

18. The apparatus of claim 14, wherein the instructions are configured to cause one or more processing devices to perform operations further comprising outputting the transactions from the verification environment, wherein bundling the plurality of the transactions is performed by the computing system outside of the verification environment.

19. The apparatus of claim 14, wherein the instructions are configured to cause one or more processing devices to perform operations further comprising utilizing the bundles of transactions to determine at least one of coherence coverage, consistence coverage, or regression efficiency for the test stimulus, or performance analysis or power analysis for the functionality of the electronic device.

20. The apparatus of claim 14, wherein the verification environment models the electronic device in a software-based implementation supported by the computing device or hardware-based implementation supported by the computing device.

* * * * *